(12) United States Patent
Jang et al.

(10) Patent No.: US 7,725,855 B1
(45) Date of Patent: May 25, 2010

(54) SYMMETRY-BASED OPTIMIZATION FOR THE PHYSICAL SYNTHESIS OF PROGRAMMABLE LOGIC DEVICES

(75) Inventors: Tetse Jang, San Jose, CA (US); Kevin Chung, Toronto (CA)

(73) Assignee: Xilinx, Inc., San Jose, CA (US)

( * ) Notice: Subject to any disclaimer, the term of this patent is extended or adjusted under 35 U.S.C. 154(b) by 186 days.

(21) Appl. No.: 11/981,910

(22) Filed: Nov. 1, 2007

(51) Int. Cl.
G06F 9/45 (2006.01)
G06F 17/50 (2006.01)

(52) U.S. Cl. .................. 716/6; 716/5; 716/10; 716/12

(58) Field of Classification Search .............. 716/4–6, 716/8–14
See application file for complete search history.

(56) References Cited

U.S. PATENT DOCUMENTS

2001/0028257 A1 10/2001 Kaptanoglu
2006/0117280 A1* 6/2006 Wallace ..................... 716/4

OTHER PUBLICATIONS

Xilinx, Inc.; U.S. Appl. No. 11/981,916 by Tetse Jang et al.; filed Nov. 1, 2007.
Manohararajah, Valavan et al.; "Timing Driven Functional Decomposition for FPGAs"; IWLS, Lake Arrowhead, CA; Jun. 2005; pp. 415-422.
Chen, Deming et al.; "DAOmap: A Depth-Optimal Area Optimization Mapping Algorithm for FPGA Designs"; Copyright 2004 IEEE; pp. 752-759.
Mischenko, Alan et al.; "Improvements to Technology Mapping for LUT-Based FPGAs"; IEEE Transactions on Computer-Aided Design of Integrated Circuits and Systems; vol. 26, No. 2; Feb. 2007; Copyright 2007 IEEE; pp. 240-253.
Lai, Yung-Te et al.; "BDD Based Decomposition of Logic Functions with Application to FPGA Synthesis"; 30th ACM/IEEE Design Automation Conference; Copyright 1993 ACM; pp. 642-647.
Stanion, Ted et al.; A Method for Finding Good Ashenhurst Decompositions and Its Application to FPGA Synthesis:' 32nd ACM/IEEE Design Automation Conference; Copyright 1995 ACM; pp. 1-5.
Jiang, Jie-Hong et al.; "Unified Functional Decomposition via Encoding for FPGA Technology Mapping"; IEEE Transactions on Very Large Scale Integration (VLSI) Systems; vol. 9, No. 2; Apr. 2001; Copyright 2001 IEEE; pp. 251-260.

(Continued)

*Primary Examiner*—Paul Dinh
*Assistant Examiner*—Nha T Nguyen
(74) *Attorney, Agent, or Firm*—Kevin T. Cuenot; Lois D. Cartier (57) ABSTRACT

A computer-implemented method of improving timing of a circuit design for a programmable logic device can include identifying a timing critical wire of the circuit design and determining a fanout free cone coupled to a plurality of leaf nodes, wherein the critical wire links a critical leaf node of the plurality of leaf nodes with the fanout free cone. At least one leaf node set can be selected, wherein the leaf node set includes a plurality of symmetric leaf nodes including the critical leaf node and at least one non-critical leaf node. At least two leaf nodes of a leaf node set can be swapped in the circuit design. The circuit design can be output.

20 Claims, 4 Drawing Sheets

OTHER PUBLICATIONS

David Dye; "Physical Synthesis and Optimization with ISE 9.1i"; White Paper: Virtex and Spartan FPGAs; WP230 (v1.1); May 16, 2007; available from www.Xilinx.com; pp. 1-9.

Singh, Deshanand P. et al.; "Two-Stage Physical Synthesis for FPGAs"; IEEE 2005 Custom Integrated Circuits Conference; Copyright 2005 IEEE; pp. 171-178.

Manohararajeh, Valavan et al.; Heuristics for Area Minimization in LUT-Based FPGA Technology Mapping; IEEE Transactions on Computer-Aided Design of Integrated Circuits and Systems; vol. 25, No. 11; Nov. 2006; Copy right 2006 IEEE; pp. 2331-2340.

Ding, Yuzheng et al.; "The Effect of Post-Layout Pin Permutation on Timing"; FPGA '05; Feb. 20-22, 2005; Copyright 2005 ACM; pp. 41-50.

Suaris, Peter et al.; "Incremental Physical Resynthesis for Timing Optimization"; FPGA '04; Feb. 22-24, 2004; Copyright 2004 ACM; pp. 99-108.

Zhang, Jin S. et al.; "Symmetry Detection for Large Boolean Functions Using Circuit Representation, Simulation, and Satisfiability"; Design Automation Conference 2006; 43rd ACM/IEEE; Jul. 24-28 2006; pp. 510-515.

Fotuhi-Firuzabad, M. et al., "A Novel Approach to Determine Minimal Tie-Sets of Complex Network." *IEEE Transactions on Reliability*, Mar. 2004, pp. 61-70, vol. 53, No. 1, IEEE, Piscataway, New Jersey, USA.

Ling, Andrew C., "BddCut: Towards Scalable Symbolic Cut Enumeration," *Proc. of the 2007 Asia & South Pacific Design Automation Conference*, Jan. 23, 2007, pp. 408-413, IEEE Computer Society, Washington, DC, USA.

\* cited by examiner

SYMMETRY-BASED OPTIMIZATION FOR THE PHYSICAL SYNTHESIS OF PROGRAMMABLE LOGIC DEVICES

FIELD OF THE INVENTION

The embodiments disclosed herein relate to integrated circuit devices (ICs). More particularly, the embodiments relate to improving timing of a circuit design to be implemented within a programmable logic device type of IC through selective swapping of signals.

BACKGROUND

The process of implementing a circuit design within a programmable logic device (PLD) typically begins with an architecture description of the circuit design. This description can be specified in a hardware description language such as Verilog or VHDL. Most circuit designs have one or more timing requirements that must be observed. The timing requirements can be expressed within the programmatic description of the circuit design or as supplemental information or files accompanying the circuit design.

Electronic Design Automation (EDA) tools can process the circuit design in an attempt to find an implementation for a given PLD that meets the timing requirements. The EDA tool typically converts the HDL description of the circuit design into a gate-level representation of the circuit design. With respect to field programmable gate array type PLDs, the gate level description can be technology mapped to vendor specific structures available within the PLD. Elements of the circuit design are assigned to different components of the PLD, e.g., lookup tables, flip-flops, block random access memories, processors, configurable logic blocks, and the like.

The EDA tool can place the technology mapped circuit design. Placing refers to the assignment of elements of the circuit design, now associated with components of the PLD, to pre-fabricated sites, or locations, on the PLD. After placement, connections of the circuit design can be routed to generate a routed circuit design. The resulting circuit design is transformed into a bitstream that, when loaded into the PLD, configures the PLD to implement the circuit design.

Reduction in internal delays of PLDs can increase operational speed and efficiency. In earlier PLDs, logic delays were largely dominant over interconnect delays. That is, delays associated with the components of PLDs were larger than the delays associated with the wires connecting those components. With the growing complexity of modern PLDs and the proliferation of sub-micron technology, interconnect delays have become dominant over logic delays. As such, any attempts to reduce delay in modern PLDs must address interconnect delays.

SUMMARY

The embodiments disclosed herein relate to programmable logic devices (PLDs) and, more particularly, to improving timing of circuit designs implemented within PLDs. One embodiment of the present invention can include a computer-implemented method of improving timing of a circuit design for a PLD. The method can include identifying a timing critical wire of the circuit design and determining a fanout free cone coupled to a plurality of leaf nodes of the circuit design. The timing critical wire can link a critical leaf node of the plurality of leaf nodes with a node of the fanout free cone. One or more leaf node sets including a plurality of symmetric leaf nodes can be selected. Each leaf node set can include the critical leaf node and at least one non-critical leaf node. Two or more leaf nodes of a leaf node set can be swapped in the circuit design. The circuit design can then be output.

Determining the fanout free cone can include determining a plurality of fanout free cones, wherein, for each of the plurality of fanout free cones, the critical wire connects the fanout free cone with the critical leaf node. Swapping the two or more leaf nodes can include swapping the critical leaf node and at least one non-critical leaf node. The swapping also can include selectively swapping at least two leaf nodes of a leaf node set in the circuit design according to a delay of the timing critical wire.

The computer-implemented method can include, for the fanout free cone, determining each pair of symmetric leaf nodes including the critical leaf node and a non-critical leaf node. The computer-implemented method can also include, for the fanout free cone, identifying a transitive relationship between the critical leaf node and one or more non-critical leaf nodes and defining the critical leaf node and each non-critical leaf node identified as having a transitive relationship with the critical leaf node as a leaf node set.

The computer-implemented method can include accepting the swapped leaf nodes according, at least in part, to a delay reduction in the critical wire. For example, a timing analysis can be performed upon at least a portion of the circuit design and the swapped signals can be selectively accepted according to results of the timing analysis.

Another embodiment of the present invention can include a computer-implemented method of improving timing of a circuit design for a PLD including identifying a timing critical wire of the circuit design and determining at least one fanout free cone coupled to a plurality of leaf nodes of the circuit design. For each fanout free cone, the timing critical wire can link a critical leaf node of the plurality of leaf nodes with a node of the fanout free cone.

For at least one fanout free cone, one or more leaf node sets can be identified. The leaf node sets can include a plurality of symmetric leaf nodes, wherein the plurality of symmetric leaf nodes include the critical leaf node and at least one non-critical leaf node. Each leaf node can be associated with a signal linking the leaf node to a node in the fanout free cone.

Signals of the critical leaf node and at least one non-critical leaf node of a leaf node set can be selectively swapped according to criticality of the timing critical wire. The circuit design then can be output.

Identifying at least one leaf node set can include, for the at least one fanout free cone, identifying each pair of symmetric leaf nodes including the critical leaf node and a non-critical leaf node. Transitive relationships between at least two pairs of symmetric leaf nodes can be identified. Identified pairs of symmetric leaf nodes can be defined as a leaf node set.

Selectively swapping signals can include performing a timing analysis upon at least a portion of the circuit design and selectively accepting the swapped signals according, at least in part, to whether criticality of the timing critical wire is reduced.

Yet another embodiment of the present invention can include a computer program product including a computer-usable medium having computer-usable program code that, when executed by an information processing system, causes the information processing system to perform the various steps and/or functions disclosed herein.

DETAILED DESCRIPTION OF THE DRAWINGS

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to improving circuit performance through the reduction of interconnect delays within integrated circuits (ICs) such as programmable logic devices (PLDs). In accordance with the embodiments disclosed herein, a critical wire or connection of a circuit design can be identified. In the present specification, the same reference characters are used to refer to terminals, signal lines, wires, and their corresponding signals. In this regard, the terms "signal," "wire," "connection," and "terminal" may be used interchangeably within the present specification. Within the circuit design, one or more fanout-free cones (FFCs) having a plurality of leaf nodes can be identified.

Each of the FFCs identified can have a leaf node that is coupled to a node in the FFC via the critical wire. The node linked to the FFC via the critical wire can be referred to as a "critical leaf node." The leaf nodes of each FFC can be processed to identify sets of symmetric leaf nodes that include the critical leaf node and a non-critical leaf node. Symmetric leaf nodes can be swapped or exchanged according to whether the timing of the circuit design improves as a result of the swapping operation. Thus, within a circuit design, for a given set of symmetric leaf nodes, a signal linking the critical leaf node with the FFC can be exchanged with a signal linking the non-critical leaf node with the FFC. Exchanging signals in this manner can improve timing of the circuit design while leaving functionality unchanged. No changes in the placement of the circuit design need be implemented to realize such timing improvements.

Figure 1:
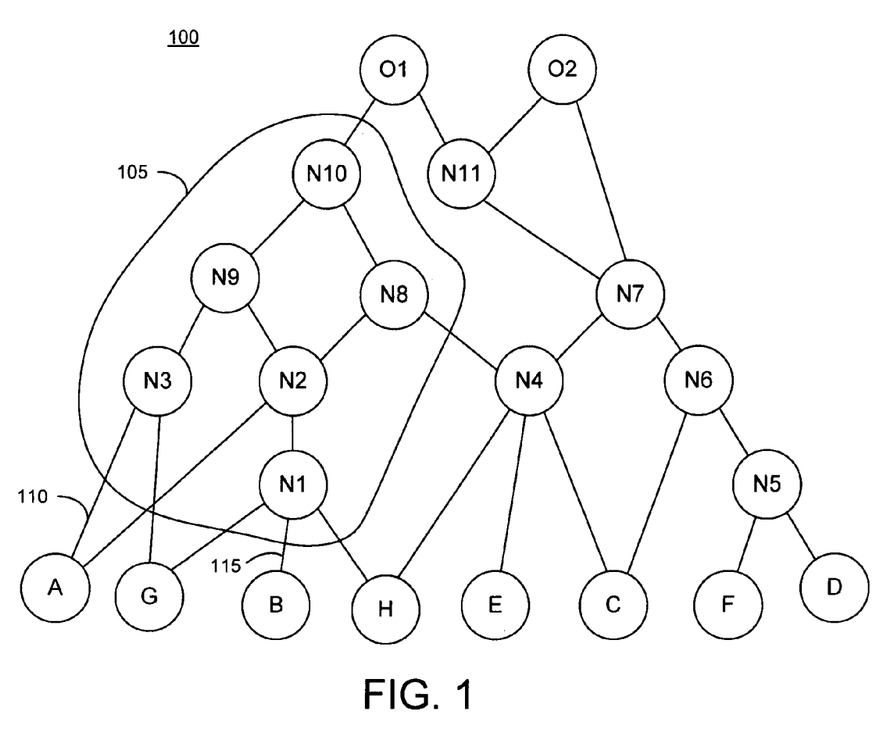
FIG. 1 is a directed acyclic graph illustrating signal swapping in accordance with one embodiment of the present invention.

FIG. 1 is a directed acyclic graph (DAG) 100 illustrating signal swapping in accordance with one embodiment of the present invention. As is known, a Boolean network can be represented as a DAG in which nodes, such as nodes N1-N11, represent Boolean functions. The branches, or edges, linking the nodes represent Boolean variables. Within the DAG 100, for each node N1-N11, there can be an associated function $F(N_i)$ and a Boolean variable $y(N_i)$ that is output from the node such that $F(N_i)=y(N_i)$. Due to this relationship, the swapping of a node is essentially the same as the swapping of a signal.

Circuit designs often are represented in programmatic form as a DAG, such as DAG 100. It should be appreciated that while the DAG 100 is graphically illustrated, the DAG 100 can be implemented or stored in memory and need not be graphically or visually presented. Components of a circuit design correspond to Boolean functions which generally are represented as nodes. Signals linking the components of a circuit design correspond to Boolean variables which generally are represented as branches connecting the nodes. For example, each of nodes N1-N11, nodes A-H, and nodes O1 and O2 can be mapped to an available component of a PLD. It should be appreciated that nodes can be mapped to components on a one-to-one basis. Alternatively, groups of one or more nodes can be formed and each group can be mapped to one or more components of the PLD.

The DAG 100 includes two primary output nodes O1 and O2. The primary output nodes correspond to sinks in the Boolean network in that no edges leave the output nodes O1 and O2. The DAG 100 also can include one or more primary input nodes or sources (not shown) which can feed into or drive the plurality of nodes labeled A-H. In the context of a circuit design for a PLD, e.g., a field programmable gate array (FPGA), the primary output nodes O1 and O2 and the primary input nodes can represent clocked logic such as a register or the like. The nodes N1-N11 and A-H of the DAG 100 can represent combinatorial logic that is not clocked.

Region 105 encompasses a plurality of nodes defining an exemplary FFC. As shown, the FFC 105 includes nodes N1, N2, N3, N8, N9, and N10. To better illustrate the nature of the FFC 105, it is useful to consider the following definitions and discussion. A node $N_i$ can be said to be a "fanin" of another node $N_j$ if there is a directed edge, e.g., a branch, leading from node $N_i$ to node $N_j$. The edge can be denoted as $\{N_i,N_j\}$. A node $N_i$ can be said to be a "fanout" of another node $N_j$ if there is a directed edge, e.g., a branch, leading from node $N_j$ to node $N_i$, which can be denoted as $\{N_j,N_i\}$.

A node $N_i$ can be said to be a "transitive fanin" of another node $N_j$ if there is a directed path from $N_i$ to $N_j$. A node $N_i$ can be said to be a "transitive fanout" of a node $N_j$ if there is a directed path from $N_j$ to $N_i$. A "cut" of a node N is a set of nodes of the DAG 100, called leaves, such that each path from a primary input to N passes through at least one leaf. A "cone" of node N is a subset of all nodes of the DAG reachable through the fanin edges from the given node. Node N is called the root of the cone.

With the above terms in mind, an FFC, such as FFC 105, can be defined as a cone in which the fanouts of every node other than the root are in the same cone. That is, the fanouts of every node of an FFC, excluding the root node, converge to the root node. Referring to the FFC 105, node N10 can be the root node. The leaf nodes of FFC 105 can be nodes A, G, B, H, and N4. Node N4 is excluded from FFC 105 since one fanout from node N4 extends to node N7 and, therefore, does not converge to node N10.

For purposes of illustration, consider the case in which edge 110 connecting node A and node N3, also denoted as {A,N3}, represents a timing critical wire in the circuit design represented by DAG 100. The criticality of a connection can be measured by the "slack" of a connection. Slack refers to the difference between the time a signal is to arrive at a particular destination to meet established timing constraints and the actual time, or estimated time as determined by an electronic design automation (EDA) tool, at which the signal arrives.

Thus, a positive slack indicates that the delay for the connection is smaller than the timing constraint imposed upon the connection. A connection with a positive slack conforms with the timing constraint. A slack that is less than zero indicates a connection having a delay that is greater than the timing constraint imposed upon the connection. A negative slack therefore indicates a connection that is failing a timing constraint. A connection having a negative slack can be said to be timing critical. The more negative the slack, the more timing critical the connection.

With a critical edge 110 being identified, node A can be said to be a critical leaf node in that node A is coupled directly to a node in the FFC 105 via the critical edge 110. Node A can be said to be a source of wire 110. In accordance with the embodiments disclosed herein, one or more other leaf nodes of the FFC 105, e.g., nodes G, B, H, and/or N4, that are coupled to the FFC 105 via a non-critical edge and which are symmetric with node A can be identified.

Within Boolean functions, two variables a and b of a function $f(\ldots, a, \ldots, b \ldots)$ are symmetric if the function remains invariant when the variables are swapped. Accordingly, the variables a and b are said to be symmetric if $f(\ldots, a, \ldots, b \ldots) = f(\ldots, b, \ldots, a \ldots)$. In the event that a function has two pairs of symmetric variables such as (a,b) and (b,c), then the variable pair (a,c) is also symmetric.

This property, called transitivity, allows one to permute more than two variables simultaneously. Consider the case where (a,b,c,d) are symmetric. The following condition holds true: $f(\ldots, a, \ldots, b, \ldots, c, \ldots, d, \ldots) = f(\ldots, a, \ldots, d, \ldots, b, \ldots, c, \ldots) = f(\ldots, d, \ldots, a, \ldots, b, \ldots, c, \ldots)$. Symmetry can be found in various circuit configurations, e.g., AND gates, XOR gates, and OR gates. Within an AND gate, for instance, all of the input signals are symmetrical, e.g., (a,b,c,d)=(a,c,b,d)=(d,c,b,a).

Several commercially available software-based analysis tools can evaluate Boolean functions, whether specified as a DAG or in other form, to identify pairs of symmetric variables and identify transitive relationships. One example of such an analysis tool is the ABC system from the Berkeley Logic Synthesis and Verification Group. Another example is MVSIS: Logic Synthesis and Verification, which is also available from the Berkeley Logic Synthesis and Verification Group.

Referring again to FIG. 1, if nodes A and B are determined to form a symmetric pair, and edge 115 is non-critical, nodes A and B can be swapped. Swapping nodes A and B effectively swaps the signals 110 and 115. Accordingly, node A will connect to node N1 rather than node N3. Node B will connect to node N3 and N2 rather than node N1. A timing analysis can be performed to determine whether the delay characteristics of the circuit have improved in consequence of the swapped nodes.

It should be appreciated that in cases where transitivity applies, more than two edges may be permuted simultaneously. In illustration, if nodes A, B, and G are symmetric, one or more or all of the nodes can be permuted with respect to one another simultaneously, e.g., during a same swap operation or iteration. For example, nodes A and G can be swapped. Nodes A and B can be swapped. From left to right across FIG. 1, the nodes can be permuted so that the ordering is node B, A, and G (as opposed to node A, G, and B).

Figure 2:
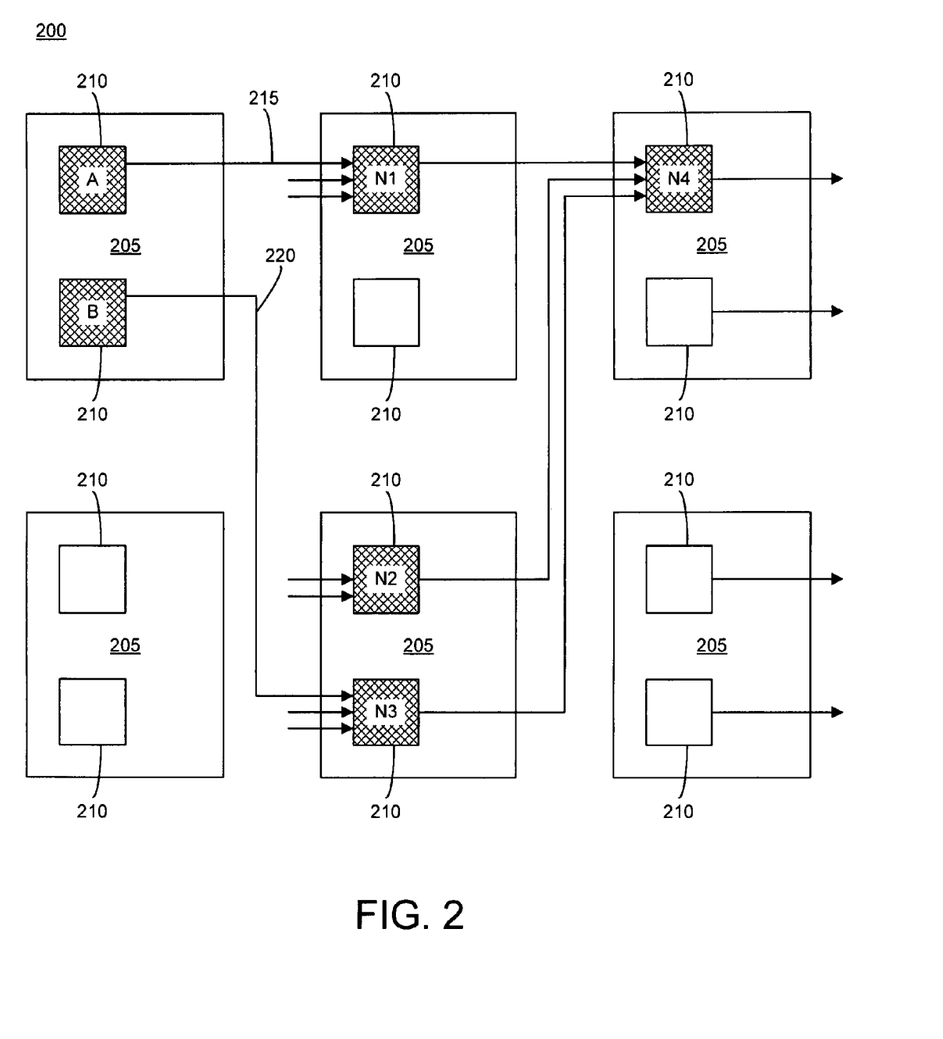
FIG. 2 is a block diagram illustrating a programmable logic device (PLD) in which a circuit design is implemented in accordance with another embodiment of the present invention.

FIG. 2 is a block diagram of an PLD in which a circuit design 200 is implemented in accordance with another embodiment of the present invention. PLDs are a well-known type of integrated circuit that can be programmed to perform specified logic functions. One type of PLD, the FPGA, typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnects and programmable logic. The programmable interconnects typically include a large number of interconnect lines of varying lengths interconnected by programmable interconnect points (PIPs). The programmable logic implements the logic of a user design using programmable elements that can include, for example, function generators, registers, arithmetic logic, and so forth.

As is known, some varieties of PLDs have programmable logic tiles called CLBs. Arrays of CLBs can form at least part of the programmably configurable circuitry of an FPGA. Depending upon the particular FPGA architecture used, a CLB can include various programmable elements including one or more look-up tables (LUTs). For purposes of illustration, the circuit design 200 has been generalized to include a plurality of CLBs 205. Each CLB 205 can include a plurality of LUTs 210.

The exemplary PLD of FIG. 2 is provided for purposes of illustration only and, as such, is not intended to limit the present invention. It should be appreciated that further programmable tiles having a different structure and/or more complex CLBs having fewer or more LUTs may be included and processed in accordance with the embodiments disclosed herein.

For purposes of illustration, it can be assumed that wire 220 has been identified as a timing critical wire through a timing analysis. LUT B, in reference to the terminal of LUT B coupled to wire 220, can be said to be a critical node. Wire 215, extending from a terminal of LUT A to LUT N1, can be a non-timing critical wire. Accordingly, LUT A can be identified as a non-critical node. Through a symmetrical analysis, LUTs A and B can be identified as symmetric nodes. Accordingly, wires 215 and 220 also can be said to be symmetric. As such, the two wires can be exchanged while maintaining the same circuit functionality.

Having identified LUT B as a timing critical node and wire 220 as a timing critical wire, one or more FFCs can be determined for which LUT B is a leaf node. For example, an FFC can be determined that includes LUTs (nodes) N1, N2, N3, and N4 as members. LUT N4 can function as the root node of the FFC. In this example, the FFC comprised of LUTS N1, N2, N3, and N4 has leaf nodes of LUT A and LUT B.

Because LUTs A and B are symmetric, wires 215 and 220 can be exchanged without changing the functionality of the circuit design. A review of wires 215 and 220 reveals that wire 215 is shorter than wire 220. By exchanging the two wires, the delay of the circuit design 200 can be reduced. Though the wires are exchanged, the resulting circuit design will be functionally equivalent due to the symmetry discussed herein.

Figure 3:
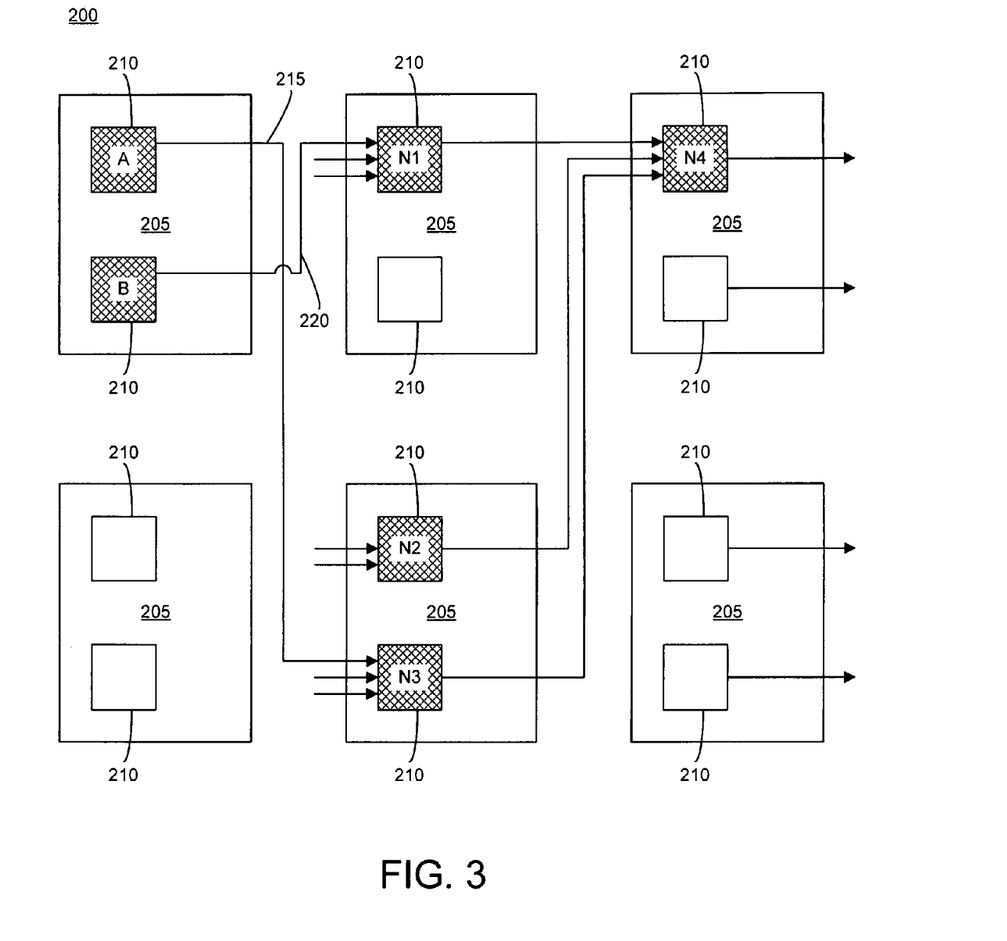
FIG. 3 is a block diagram illustrating the PLD of FIG. 2 wherein signal swapping has been performed upon the circuit design in accordance with another embodiment of the present invention.

FIG. 3 is a block diagram illustrating the PLD of FIG. 2 wherein signal swapping has been performed upon the circuit design in accordance with another embodiment of the present invention. The circuit design 200 includes the plurality of CLBs 205, each having a plurality of LUTs 210. Because LUTs A and B are symmetric, the signals 215 and 220 can be exchanged without changing the operation of the circuit design. Moreover, no alteration of the circuit design, other than the exchange of the two signals, is necessary, e.g., no other movement of LUTs or components is needed.

After swapping is performed, wire 215 extends from LUT A to LUT N3. Wire 220 now extends from LUT B to LUT N1. The resulting circuit design pictured in FIG. 3 is functionally equivalent to the circuit design of FIG. 2 despite the change in routing of signals 215 and 220. A review of the circuit design 200 of FIG. 3 (post swapping) shows that the length of wire 215 is now longer, while the length of wire 220 has become shorter. This can result in the criticality of wire 220 being reduced and/or eliminated. Wire 215 may remain non-critical. A timing analysis can be performed to verify the timing of the circuit and the signal paths. Based upon the results of the timing analysis, the swap may be accepted or rejected.

Figure 4:
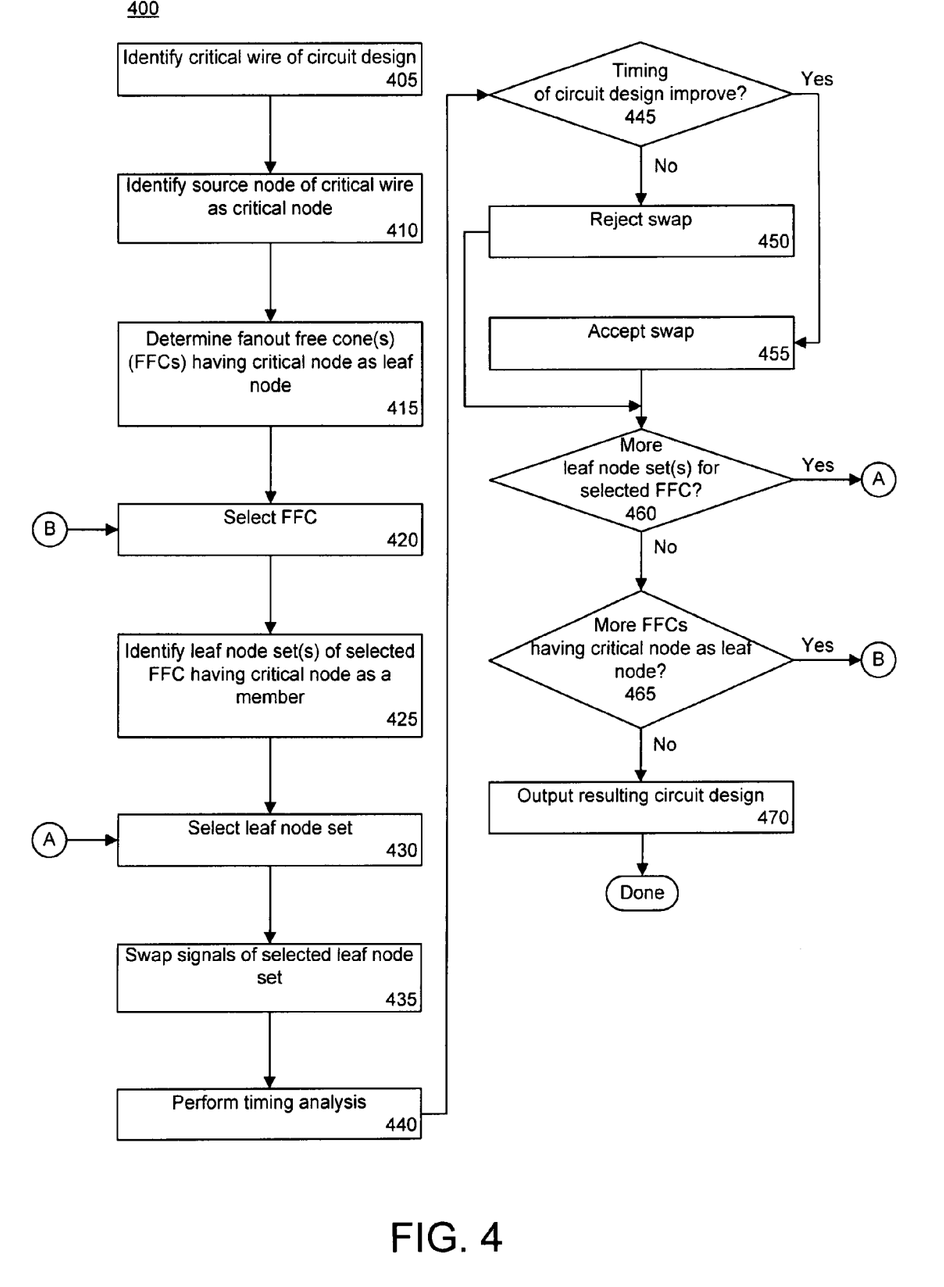
FIG. 4 is a flow chart illustrating a method of reducing delay in a circuit design in accordance with another embodiment of the present invention.

FIG. 4 is a flow chart illustrating a method 400 of reducing delay in a circuit design in accordance with another embodiment of the present invention. The method 400 can be performed by an EDA tool or another software-based circuit design tool. The method 400 can begin in a state in which the circuit design has been loaded into the design tool. The method 400 can be performed at some point during implementation, e.g., after technology mapping where signal routing can be estimated, after routing, or the like.

Accordingly, in step 405, a critical wire of the circuit design can be identified or selected through a timing analysis. In step 410, a source node of the critical wire can be identified or selected as a critical node of the circuit design. As noted, the source node can be a circuit element or the terminal of a circuit element that is coupled to the wire, e.g., outputs a signal on the critical wire.

In step 415, one or more or each FFC that has the critical node as a leaf node can be identified. The leaf nodes of each FFC, when viewed as a DAG, form the base of the FFC. Each leaf node is connected to at least one node within the FFC by a single branch or edge. Each of the FFC(s) determined in step 415 can include the critical node as a leaf node. In general, due to the high component density of modern PLDs, a circuit design will likely have a number of FFCs for a given critical node that numbers in the tens of FFCs. Commonly, each of the FFCs will include approximately 10-50 nodes. Those skilled in the art will appreciate, however, that the number of FFCs determined and the number of nodes in an FFC are provided for purposes of example only and, as such, are not intended to limit the embodiments disclosed herein.

In step 420, an FFC can be selected for processing. In step 425, sets of symmetric leaf nodes that include the critical leaf node can be identified. In one embodiment, each pair of symmetric leaf nodes including the critical leaf node and a symmetric, non-critical leaf node can be identified. Transitivity can be evaluated to generate leaf node sets. Each leaf node set can include the critical leaf node and one or more symmetric, non-critical leaf nodes. In step 430, a leaf node set identified in step 425 can be selected. In step 435, the wires of the leaf node set can be swapped as shown with reference to FIGS. 1-3. In step 440, a timing analysis can be performed upon the circuit design. The timing analysis can be performed upon the entire circuit design or any portion thereof. For example, a timing analysis can be performed upon each exchanged wire or upon each signal path including an exchanged wire.

In step 445, a determination can be made as to whether the timing of the circuit design improved as a result of swapping the wires of the selected leaf node set. For example, a determination can be made as to whether the delay between the critical leaf node and the node of the FFC to which the critical leaf node is now connected (e.g., after the swap) has increased, decreased, or remained the same. Similarly, a determination can be made as to whether the delay of the wire between the non-critical leaf node and the node of the FFC to which the non-critical leaf node is connected has increased, decreased, or remained the same. If the non-critical wire has become critical as a result of the swap, such a condition also can be identified.

In one embodiment, if the critical wire has become less critical or non-critical, while the non-critical wire remains non-critical, the EDA tool can determine that the timing of the circuit design has improved. Accordingly, the method can proceed to step 455 where the swap can be accepted. If the EDA tool determines that the timing has not improved, the method can proceed to step 450, where the swap is rejected. In that case, the signals of the leaf node set can be swapped back to the original routing or connectivity. It should be appreciated that the decision as to whether a swap is accepted can be varied according to user preference. Such a determination can focus upon the critical wire only, both the critical wire and any exchanged wire, and/or evaluate the degree to which timing of one or more of such wires improved or worsened.

In step 460, a determination can be made as to whether further leaf node sets remain to be processed. If so, the method can loop back to step 430 to continue selecting further leaf node sets until no further leaf node sets remain to be processed for the selected FFC. If not, the method can continue to step 465.

In step 465, a determination can be made as to whether further FFCs, as determined in step 415, remain to be processed. If so, the method can loop back to step 420 to select another FFC for processing. If no further FFCs remain, the method can continue to step 470, where the resulting circuit design can be output. As used herein, "outputting" and/or "output" can mean, for example, writing to a file, writing to a user display or other output device, playing audible notifications, sending or transmitting to another system, exporting, or the like.

It should be appreciated that while the method 400 has been described with reference to a single critical wire or connection, the method 400 can be repeated as may be required for processing further critical wires of the circuit design. Moreover, the embodiments disclosed herein allow any symmetric signals of an FFC to be exchanged. In this regard, flexibility is provided in that a plurality of FFCs can be processed for a given critical wire and a plurality of leaf node sets can be processed for each FFC. This leads to a situation in which many nodes, e.g., LUTs, may be manipulated in contrast to other techniques, e.g., local rewiring or "switching," which are limited in application to a selected LUT and the fanout LUT of the selected LUT.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figure. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of improving timing of a circuit design for a programmable integrated circuit, the method comprising:
    within a graph representation of the circuit design comprising nodes representing components and edges representing wires, identifying a timing critical wire of the circuit design, wherein the timing critical wire has a negative slack;
    determining from the graph, by a computer, a fanout free cone, according to the timing critical wire, that comprises a plurality of nodes linked by edges, wherein each of a plurality of leaf nodes external to the fanout free cone directly links to at least one node within the fanout free cone through an edge and, wherein the timing critical wire directly links a selected leaf node of the plurality of leaf nodes, denoted as a critical leaf node, with a node of the fanout free cone;
    selecting, by the computer, at least one leaf node set comprising a plurality of leaf nodes that are symmetric, wherein each leaf node set comprises the critical leaf node and at least one non-critical leaf node;
    swapping, by the computer, at least two wires linking leaf nodes, selected only from the leaf node set in the circuit design, to nodes within the fanout free cone; and
    storing the circuit design within memory.

2. The method of claim 1, wherein determining the fanout free cone further comprises determining a plurality of fanout free cones, wherein, for each of the plurality of fanout free cones, the timing critical wire connects the fanout free cone with the critical leaf node.

3. The method of claim 1, wherein swapping the at least two wires further comprises swapping the critical wire and at least one non-critical wire.

4. The method of claim 1, further comprising, for the fanout free cone, determining each pair of symmetric leaf nodes comprising the critical leaf node and a non-critical leaf node.

5. The method of claim 1, further comprising, for the fanout free cone:
    identifying a transitive relationship between the critical leaf node and at least one non-critical leaf node; and
    defining the critical leaf node and each non-critical leaf node identified as having a transitive relationship with the critical leaf node as a leaf node set.

6. The method of claim 1, wherein the swapping further comprises selectively swapping at least two wires of a leaf node set in the circuit design according to a delay of the timing critical wire.

7. The method of claim 6, further comprising accepting the swapped wires according, at least in part, to delay reduction in the timing critical wire.

8. The method of claim 1, further comprising:
    performing a timing analysis on at least a portion of the circuit design; and
    selectively accepting the swapped wires only when the timing critical wire is no longer critical and the non-critical leaf node remains non-critical in consequence of the swap.

9. A method of improving timing of a circuit design for a programmable integrated circuit, the method comprising:
    within a graph representation of the circuit design comprising nodes representing components and edges representing wires, identifying a timing critical wire of the circuit design;
    determining from the graph, by a computer, at least one fanout free cone, according to the timing critical wire, that comprises a plurality of nodes linked by edges, wherein each of a plurality of leaf nodes external to the fanout free cone directly links to at least one node within the fanout free cone through an edge and, wherein the timing critical wire directly links a selected leaf node of the plurality of leaf nodes, denoted as a critical leaf node, with a node of the fanout free cone;
    for at least one fanout free cone, identifying, by the computer, at least one leaf node set comprising a plurality of leaf nodes that are symmetric, wherein the plurality of symmetric leaf nodes comprise the critical leaf node and at least one non-critical leaf node;

selectively swapping wires of the critical leaf node and at least one non-critical leaf node of a leaf node set according to criticality of the timing critical wire via the computer; and storing the circuit design within memory.

10. The method of claim 9, wherein identifying at least one leaf node set comprises, for the at least one fanout free cone, identifying each pair of symmetric leaf nodes comprising the critical leaf node and a non-critical leaf node.

11. The method of claim 10, further comprising identifying transitive relationships between at least two pairs of symmetric leaf nodes and defining the at least two pairs as a leaf node set.

12. The method of claim 9, wherein selectively swapping the signals further comprises:

performing a timing analysis upon at least a portion of the circuit design; and selectively accepting the swapped wires only when the timing critical wire is no longer critical and the non-critical leaf node remains non-critical in consequence of the swap.

13. A computer program product, comprising:

a computer-usable medium having computer-usable program code that improves timing of a circuit design for a programmable integrated circuit, the computer-usable medium comprising:

computer-usable program code that identifies a timing critical wire of the circuit design within a graph representation of the circuit design comprising nodes representing components and edges representing wires;

computer-usable program code that determines, from the graph, a fanout free cone, according to the timing critical wire, that comprises a plurality of nodes linked by edges, wherein each of a plurality of leaf nodes external to the fanout free cone directly links to at least one node within the fanout free cone through an edge and, wherein the timing critical wire links a selected leaf node of the plurality of leaf nodes, denoted as a critical leaf node, with a node of the fanout free cone;

computer-usable program code that selects at least one leaf node set comprising a plurality of leaf nodes that are symmetric, wherein each leaf node set comprises the critical leaf node and at least one non-critical leaf node;

computer-usable program code that swaps at least two wires linking leaf nodes selected only from the leaf node set in the circuit design to nodes within the fanout free cone; and computer-usable program code that outputs the circuit design.

14. The computer program product of claim 13, wherein the computer-usable program code that determines the fanout free cone further comprises computer-usable program code that determines a plurality of fanout free cones, wherein, for each of the plurality of fanout free cones, the critical wire connects the fanout free cone with the critical leaf node.

15. The computer program product of claim 13, wherein the computer-usable program code that swaps at least two wires further comprises computer-usable program code that swaps the critical wire with at least one non-critical wire.

16. The computer program product of claim 13, wherein the computer-usable medium further comprises computer-usable program code that, for the fanout free cone, determines each pair of symmetric leaf nodes comprising the critical leaf node and a non-critical leaf node.

17. The computer program product of claim 13, wherein the computer-usable medium further comprises computer-usable program code that, for the fanout free cone, identifies a transitive relationship between the critical leaf node and at least one non-critical leaf node and defines the critical leaf node and each non-critical leaf node identified as having a transitive relationship with the critical leaf node as a leaf node set.

18. The computer program product of claim 13, wherein the computer-usable program code that swaps at least two wires further comprises computer-usable program code that selectively swaps at least two wires of a leaf node set in the circuit design according to delay of the timing critical wire.

19. The computer program product of claim 18, wherein the computer-usable medium further comprises computer-usable program code that accepts the swapped wires according, at least in part, to a delay reduction in the timing critical wire.

20. The computer program product of claim 13, wherein the computer-usable medium further comprises:

computer-usable program code that performs a timing analysis on at least a portion of the circuit design; and computer-usable program code that selectively accepts the swapped wires only when the timing critical wire is no longer critical and the non-critical leaf node remains non-critical in consequence of the swap.

* * * * *